US007453617B2

(12) United States Patent
Yee et al.

(10) Patent No.: US 7,453,617 B2
(45) Date of Patent: Nov. 18, 2008

(54) SCANNING DEVICE AND FABRICATION METHOD THEREOF

(75) Inventors: Young-Joo Yee, Gyeonggi-Do (KR); Chang-Hyeon Ji, Seoul (KR); Seong-Hyok Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 186 days.

(21) Appl. No.: 11/205,355

(22) Filed: Aug. 16, 2005

(65) Prior Publication Data

US 2006/0039060 A1 Feb. 23, 2006

(30) Foreign Application Priority Data

Aug. 18, 2004 (KR) .................. 10-2004-0065152
Aug. 25, 2004 (KR) .................. 10-2004-0067176

(51) Int. Cl.
*G02B 26/08* (2006.01)
(52) U.S. Cl. ..................................... 359/225
(58) Field of Classification Search .......... 359/223–226
See application file for complete search history.

(56) References Cited

U.S. PATENT DOCUMENTS 6,295,154 B1 * 9/2001 Laor et al. .................. 359/223
2005/0243396 A1 * 11/2005 Fujii et al. .................. 359/224

FOREIGN PATENT DOCUMENTS

| DE | 4224599 | 3/1994 |
| EP | 1 215 518 | 6/2002 |
| EP | 1 275 897 | 1/2003 |
| KR | 1020040015497 | 2/2004 |

* cited by examiner

*Primary Examiner*—Euncha P Cherry
(74) *Attorney, Agent, or Firm*—Lee, Hong, Degerman, Kang & Waimey

(57) ABSTRACT

A scanning device includes a mirror unit formed on a substrate so as to be pivotable centering around one axis for adjusting the direction of reflected light; a support frame formed at one surface of the mirror unit for preventing dynamic deflection of the mirror unit and supporting the mirror unit; and a driving unit provided on the substrate and driving the mirror unit. Thus, a dynamic deflection phenomenon does not occur when the mirror unit is pivoted centering around the pivoting axis. Accordingly, stable operation is possible and the angle of rotation of the mirror unit can be accurately adjusted, so that the scanning device can be effectively used in a high-speed precision scanning system.

17 Claims, 9 Drawing Sheets

SCANNING DEVICE AND FABRICATION METHOD THEREOF

CROSS REFERENCE TO RELATED APPLICATIONS

Pursuant to 35 U.S.C. § 119(a), this application claims the benefit of earlier filing date and right of priority to Korean Patent Application Nos. 65152/2004 and 67176/2004, filed on Aug. 18, 2004 and Aug. 25, 2004, the content of which is hereby incorporated by reference herein in its entirety.

BACKGROUND OF THE INVENTION

1. Field of the Invention

The present invention relates to a scanning device capable of reading information such as an image by using light and a fabrication method thereof, and particularly, to a scanning device having a micromirror constructed to improve structural stability and optical performance and a fabrication method thereof.

2. Description of the Background Art

Recently, a variety of Information transfer techniques using light as media for transferring all kinds of information have been developed. A technique for scanning information intended to be read by injecting a beam from a light source into a medium in which information is recorded is one of important techniques in the field of information transfer techniques using light.

The beam scanning technique is applied to various devices, for example, a barcode scanner, a projection display system having excellent color rendering capability with high resolution by using a laser scanning method, an HMD (Head Mounted Display) system and a laser printer.

In such a beam scanning technique, various scanning speeds and scanning ranges according to application examples to which the technique is applied are important factors for performance. In particular, in a system requiring for a high spatial resolution, a scanning mirror device capable of increasing angular displacement of a beam made incident and implementing a high scanning speed is required.

As one example of conventional scanning mirror devices, there is a polygon mirror device having a mirror in a polygon shape which is rotatably mounted to a motor being pivoted and is capable of implementing a high scanning speed up to several kilohertz (kHz). In the polygon mirror device, input light coming out of a light source passes through an optical system comprising a plurality of lenses, and is reflected by the polygon mirror in a direction where the polygon mirror is pivoted.

However, in case of a scanning device using the conventional polygon mirror, because of the limitations of rotation speed of a motor, angular velocity of the polygon mirror which depends on the rotation speed of the motor is also limited. Thus, it is difficult to increase the scanning speed. In addition, a structure that the scanning mirror is mounted on the motor increases the overall system in volume, makes it difficult to reduce power used for motor operation, generates problems with mechanical frictional noises from motor rotation, and increases the cost of production due to its complicated construction.

Accordingly, scanning devices having a micrometer structure whose entire system is small and which is manufactured using an MEMS technique capable of implementing a high scanning speed reaching tens of kilohertz (kHz) or using a general micromachining technique have been developed theses days. In the scanning device, a path of reflected light is changed according to rotation at a predetermined angle from side to side centering around torsion beams formed at both sides of the micrometer.

However, in case of the scanning device using the micrometer, since the micrometer is constructed to be extremely thin in comparison with its area, when the micrometer is operated with a high speed of tens of kilohertz (kHz), the micrometer flutters, that is, a dynamic deflection phenomenon occurs. Accordingly, a shape of a reflective surface of the micrometer is distorted and characteristics of reflected rays are deteriorated.

BRIEF DESCRIPTIOIN OF THE INVENTION

Therefore, an object of the present invention is to provide a scanning device capable of preventing dynamic deflection that a micromirror flutters by improving structural stability of the micromirror and implementing a wide scanning angle and a high scanning speed.

In addition, it is another object of the present invention to provide a fabrication method of a scanning device which has a micromirror structure with structural stability and makes a contribution to a light scanning device which is leaner and lighter by using a semiconductor batch process and a micromachining technique.

To achieve these and other advantages and in accordance with the purpose of the present invention, as embodied and broadly described herein, there is provided a scanning device comprising: a mirror unit formed on a substrate so as to be pivotable centering around one axis for adjusting the direction of reflected light; a support frame formed at one surface of the mirror unit for preventing dynamic deflection of the mirror unit and supporting the mirror unit; and a driving unit provided on the substrate and driving the mirror unit.

To achieve these and other advantages and in accordance with the purpose of the present invention, as embodied and broadly described herein, there is provided A fabrication method of a scanning device including a mirror unit formed on a substrate so as to be pivotable around one axis and a driving unit for driving the mirror unit, comprising: patterning a support frame at one surface of the mirror unit for preventing dynamic deflection of the mirror unit by an etch process.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
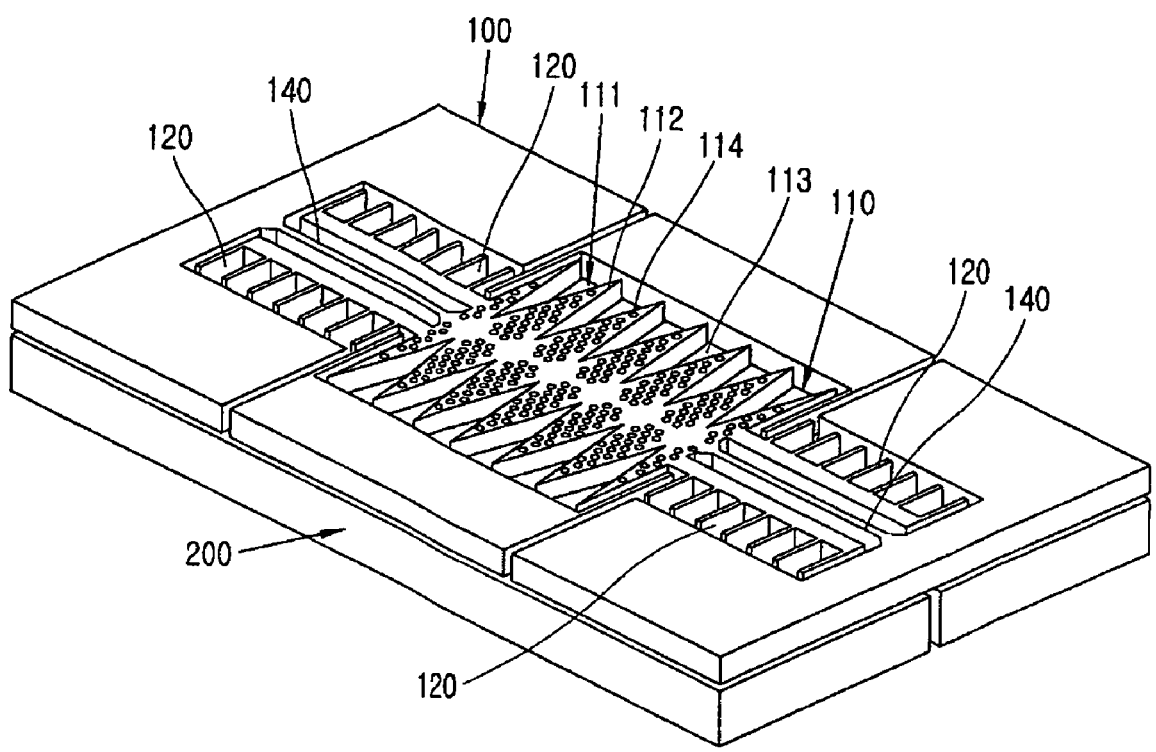
FIG. 1 is a perspective view of a scanning device in accordance with one embodiment of the present invention.
Figure 2:
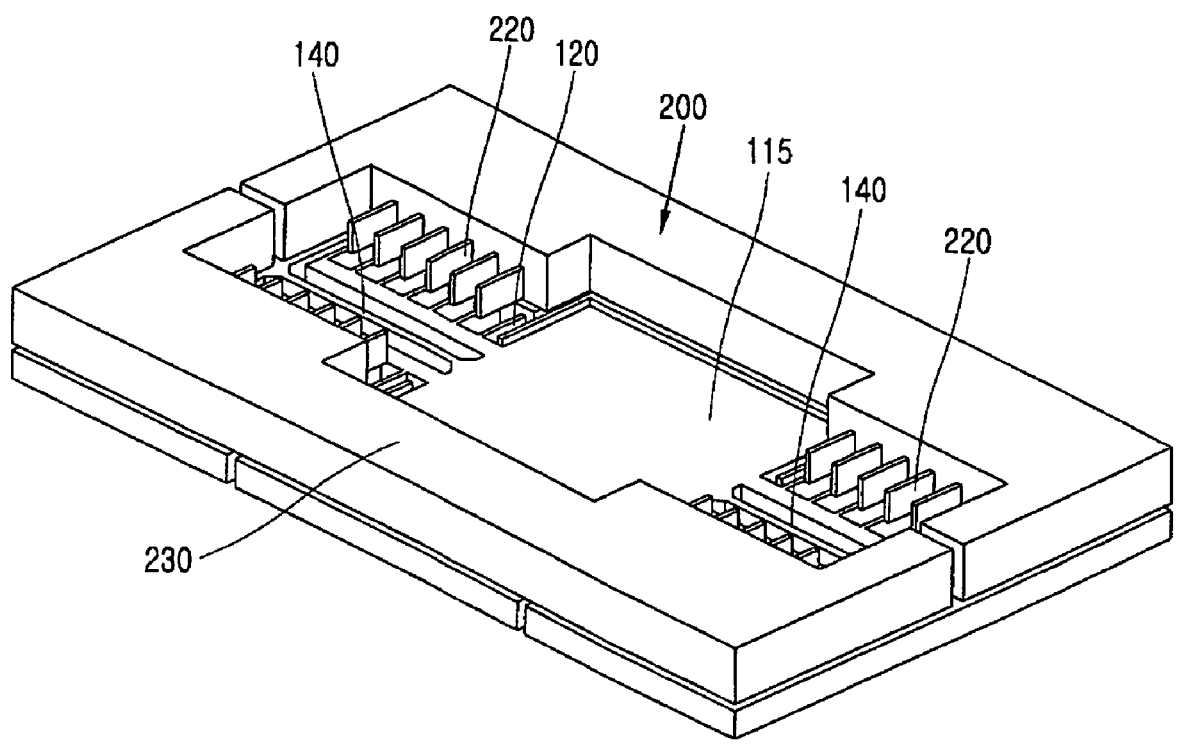
FIG. 2 is a perspective view illustrating a lower surface of the scanning device of FIG. 1.
Figure 3:
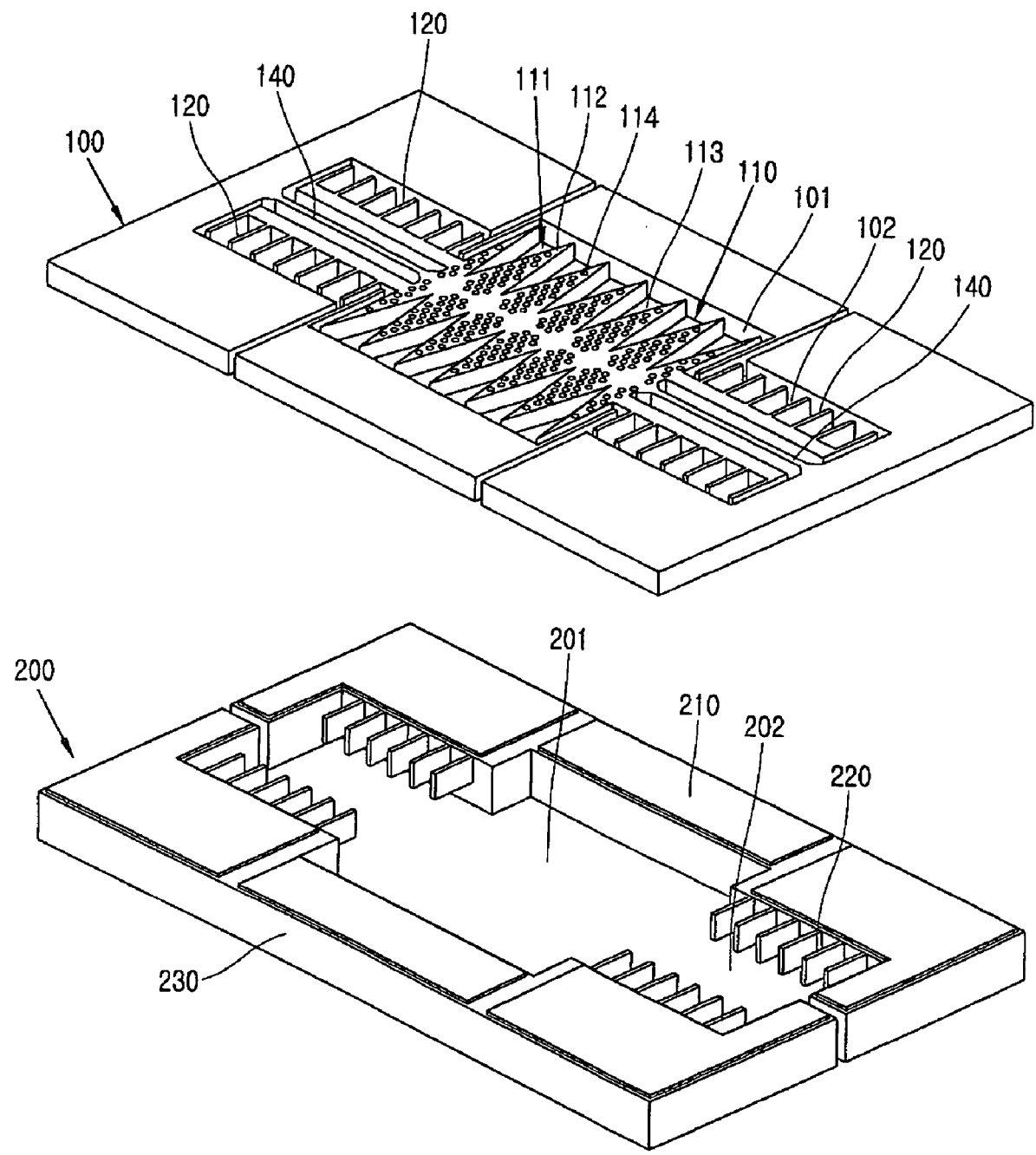
FIG. 3 is a disassembled perspective view the scanning device of FIG. 1.
Figure 4:
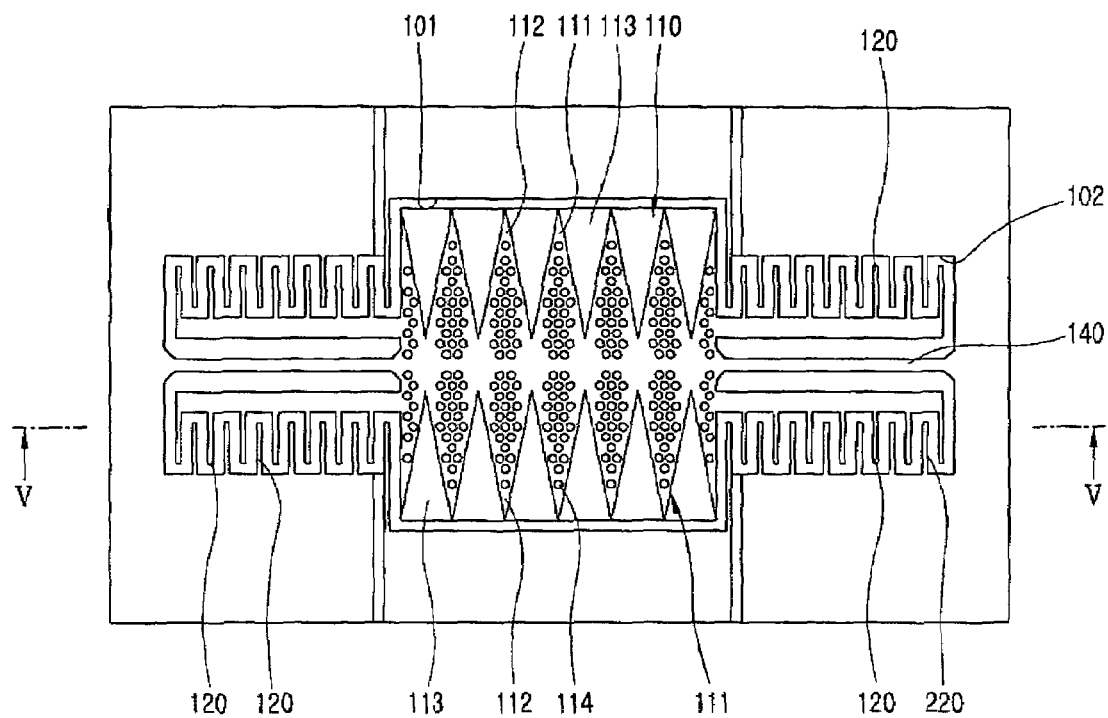
FIG. 4 is a front view of the scanning device of FIG. 1.
Figure 5:
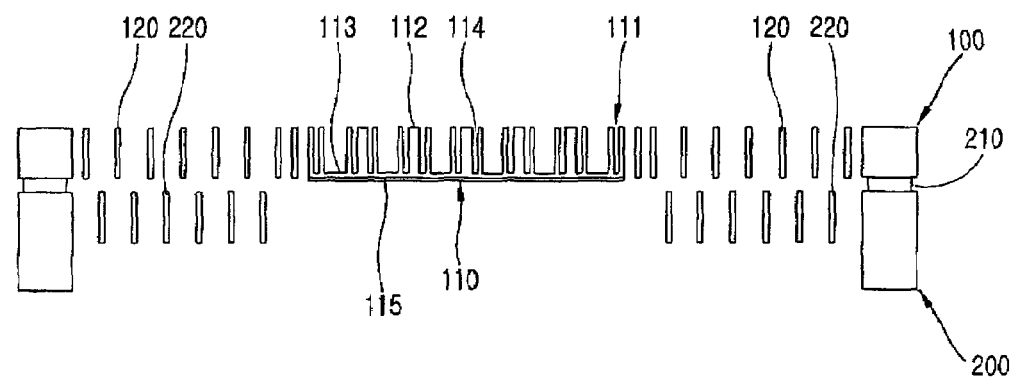
FIG. 5 is a sectional view taken along V-V line of FIG. 4.

Hereinafter, a scanning device of the present invention will be described in detail with reference to one embodiment illustrated in the accompanying drawings.

FIGS. 1 to 5 illustrate a scanning device in accordance with one embodiment of the present invention.

As illustrated therein, a scanning device in accordance with one embodiment of the present invention includes: a mirror unit 110 formed on a substrate so as to be pivotable centering around one axis in order to adjust the direction of reflected light; a support frame 111 formed at one surface of the mirror unit 110 so as to prevent dynamic deflection of the mirror unit 110 and supporting the mirror unit 110; and a driving unit provided on the substrate and driving the mirror unit 110. Here, since the mirror unit 110 is a fine structure by unit of micron, hereinafter the mirror unit 110 will be referred to as a micromirror unit.

A construction of the scanning device according to one embodiment of the present invention will be described in more detail.

The substrate is constructed by vertically laminating and bonding an upper substrate 100 and a lower substrate 200 to each other. The upper substrate 100 has a first center space portion 101 which is penetratingly formed such that the micromirror unit 100 can be rotatably installed at its inner center. A pair of elastic rotation support elements 140 are formed at both ends of the micromirror unit 110 to thereby support the micromirror unit 110 against the upper substrate 100.

As both end portions of the micromirror unit 110 are connected to the upper substrate 100 by a pair of elastic rotation support elements 140, the micromirror unit 110 can be pivoted up and down through a certain angle with the elastic rotation support elements 140 as the pivoting axis.

Here, as the elastic rotation support element 140 for connecting the micromirror unit 110 to the upper substrate 100, a cantilever or various elastic structures being transformed as well as the torsion beam illustrated in the drawing can be applied. Hereinafter, a description will be made by using the torsion beam, as in the embodiment illustrated in the drawing, as the elastic rotation support element 140.

The lower substrate 200 comprises two electrode fixing units 230 which are electrically separated from each other. In addition, a second center space portion 201 through which light incident upon a reflective surface 115 of the micromirror unit 110 and reflected light reflecting therefrom can pass is penetratingly formed at the center of the lower substrate 200, corresponding to the first center space portion 101 of the upper substrate 100.

The driving unit includes a movable comb electrode 120 provided on the upper substrate 100, and a fixed comb electrode 220 provided on the lower substrate 200 and interacting with the movable comb electrode 120 by an electrostatic force. First side space portions 102 are penetratingly formed at both inner sides of the upper substrate 100 along an axial direction of the torsion beam 140 so as to communicate with the first center space portion 101. The movable comb electrodes 120 extend from both sides of the micromirror unit 110 in order to be disposed at the left and right of the torsion beam 140. In addition, the movable comb electrode 120 can be pivoted together with the micromirror unit 110 at a certain angle with the torsion beam 140 as an axis in the first side space portion 102.

Second side space portion 202 communicating with the second center space portion 201 are penetratingly formed at both inner sides of the lower substrate 200 in order to correspond to the first side space portions 102. The fixed comb electrode 220 is formed at an inner side surface of the second side space portion 202 such that the fixed comb electrode 220 and the movable comb electrode 120 alternate with each other in the axial direction of the torsion beam 140. That is, since the fixed comb electrodes 220 are formed at the two electrode fixing units 230, respectively, they are electrically separated from each other. In addition, the movable comb electrode 120 and the fixed comb electrode 220 are separated from each other by a predetermined distance as in the drawing or may partially overlap each other.

In addition, the present embodiment shows a structure that the movable comb electrode 120 and the fixed comb electrode 220 as one pair for the operation of the micromirror unit 110 are formed at both ends in relation to the micromirror unit 110. However, according to design, the movable comb electrode 120 and the fixed comb electrode 220 may be formed only at one side of the micromirror unit 110.

Meanwhile, as the upper substrate 100 and the lower substrate 200 are connected to outside power, a voltage is applied to the movable comb electrode 120 and the fixed comb electrode 220. Here, an insulating layer 210 is formed between the upper and lower substrates 100 and 200 for electrical insulation.

Hereinafter, the micromirror unit 110 and the support frame 111 formed thereon will be described.

The support frame 111 is constructed in such a manner that a plurality of diamond-shaped protrusion portions 112 and a plurality of triangle-shaped groove portions 113 are alternately and periodically formed. The thickness of the diamond-shaped protrusion portion 112 is very small in comparison to the area of the support frame 111. Here, the support frame 111 should have a symmetrical structure in relation to the axis on which the micromirror unit 110 is pivoted in order that the micromirror unit 110 can be pivoted at an exact angle from side to side. In addition, the support frame 111 decreases in mass toward both ends from the pivoting axis of the micromirror unit 110 in order to reduce the moment of inertia being generated when the micromirror unit 110 is pivoted centering around the pivoting axis.

In addition, the reflective layer 115 in the shape of a thin film having uniform thickness is formed at the other surface of the micromirror unit 110, i.e., a surface facing the second center space portion 201, in order to reflect input light. Here, since the area of the micromirror unit 110 is greater than that of the support frame 111, the area of the surface which has the reflective layer 115 of the micromirror unit 111 formed thereon is greater than that of the support frame 111. Accordingly, reflection efficiency is improved.

A plurality of recesses 114 are formed at each protrusion portion 112 in order to reduce mass of the support frame 111. Such recesses may have various shapes according to designs, but preferably, they have a hexagonal shape to entirely form a honey comb shape in an aspect of structural stability.

Here, preferably, the entire volume of the recesses 114 is not much greater than that of the support frame 111 in order to improve strength of the support frame 111 and structural stability of the micromirror unit 110. That is, void ratio of the support frame 111 can vary according to design of the scanning device.

Meanwhile, the support frame 111 may have various shapes in addition to one according to one embodiment of the present invention.

FIGS. 8 to 11 show various shapes of a support frame formed on a mirror unit. Reference numerals given to a mirror unit and a support frame are the same as those in the above-described one embodiment of the present invention for the purpose of simplicity.

Figure 8:
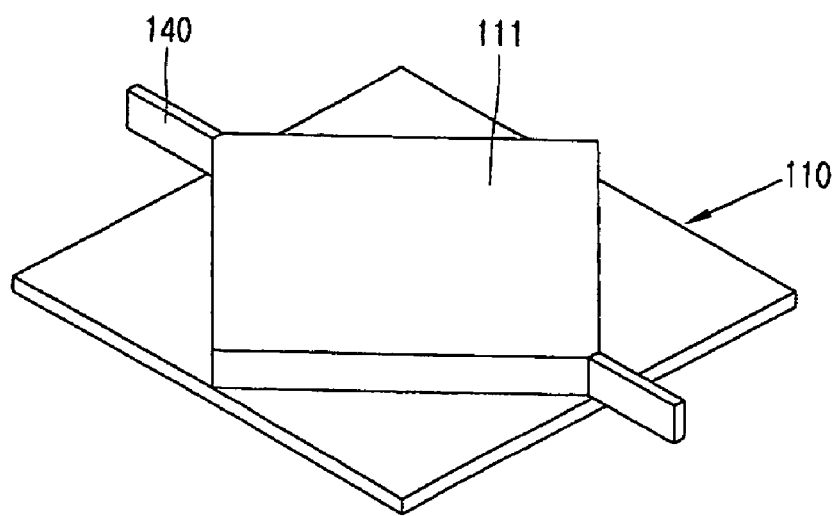
FIGS. 8 to 11 are perspective views illustrating various examples of a support frame of the micromirror in accordance with the present invention.
Figure 9:
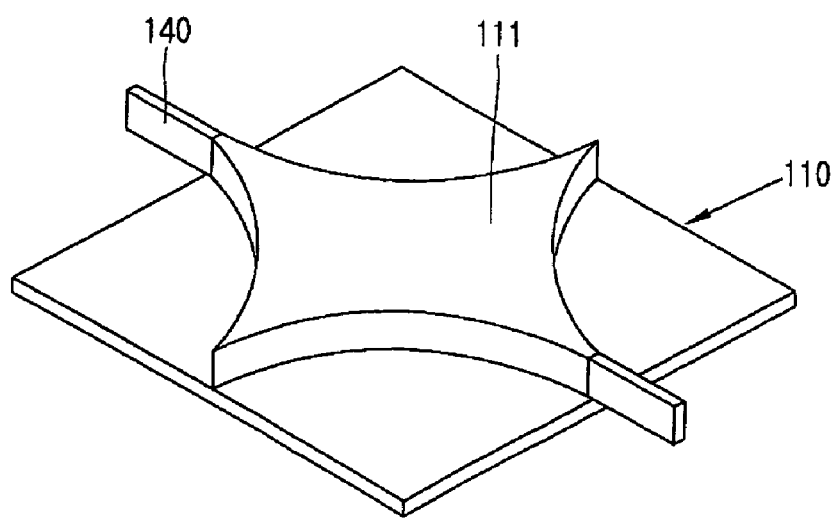
Figure 10:
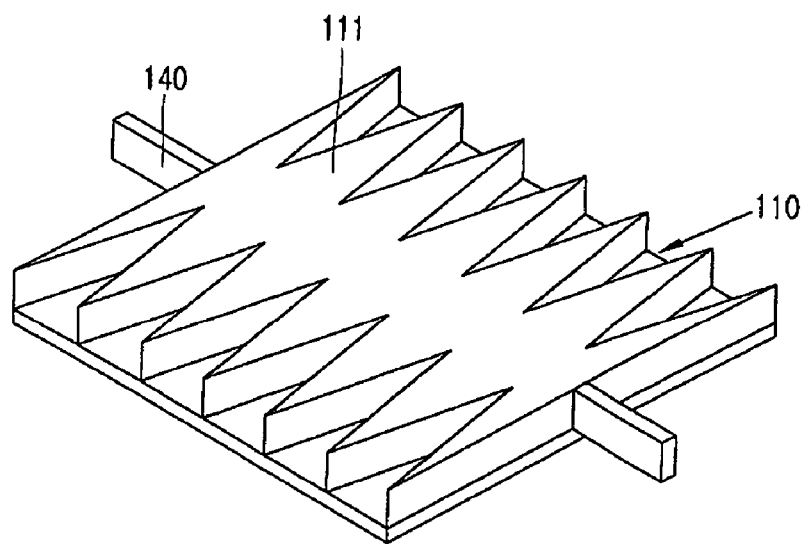
Figure 11:
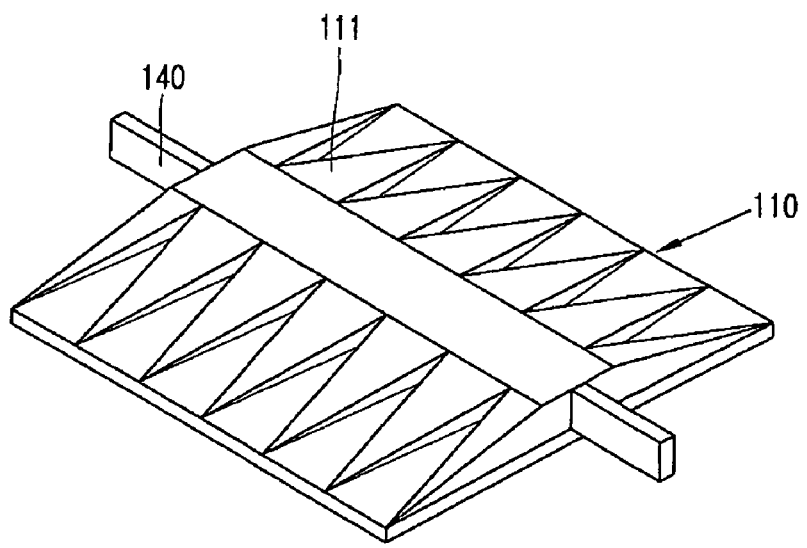

With reference to FIG. 8, the support frame 111 is formed as a hexahedron which upper surface is lozengeshaped at one surface of the micromirror unit 110. Here, diagonally opposite apexes of the support frame 111 are formed to meet the torsion beam 140 to thusly obtain a structure of the support frame 111 of which mass decreases toward both ends in relation to the pivoting axis of the micromirror unit 110. With reference to FIG. 9, from the shape of the support frame 111 illustrated in FIG. 8, four side surfaces are curved toward the center of the support frame to thereby reduce mass of the support frame 111. In addition, FIG. 10 shows the shape of the support frame 111 according to one embodiment of the present invention, in which a plurality of recesses are not formed. As illustrated in FIG. 11, the support frame 111 has the same shape as one embodiment of the present invention, and gradually decreases in thickness toward the end from the pivoting axis.

In addition to the various shapes of the support frame, any shape thereof can be possible as far as the shape of the support frame improves structural stability of the micromirror unit and reduces the moment of inertia of rotation and mass.

Hereinafter, a fabrication method of the scanning device in accordance with one embodiment of the present invention by semiconductor batch process and microfabrication technology, so called, MEMS technology will be described.

Figure 12:
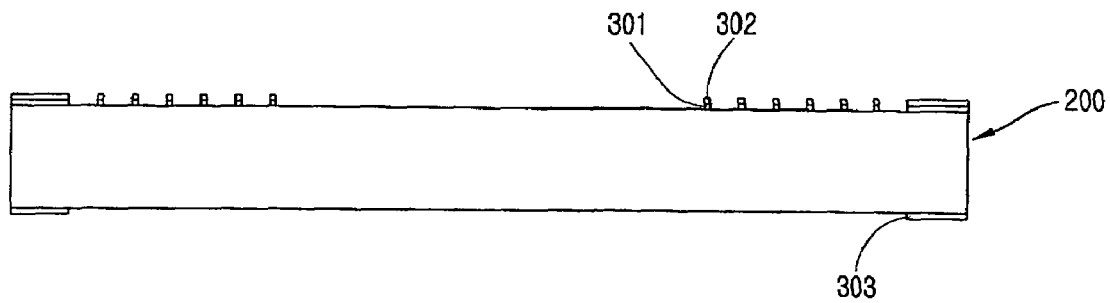
FIGS. 12 to 18 are views illustrating sequential processes of fabricating the scanning device in accordance with one embodiment of the present invention which is illustrated in FIG. 1.
Figure 18:
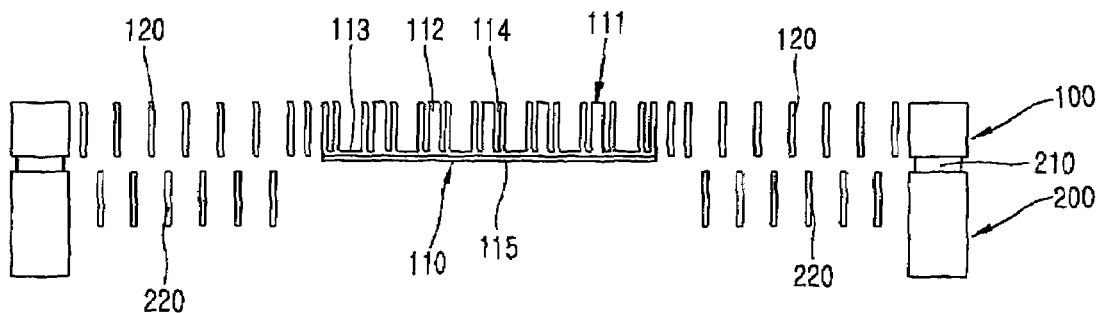

FIGS. 12 and 18 illustrate sequential processes of a fabrication method of the scanning device in accordance with one embodiment of the present invention. In the drawings, for the purpose of simplicity, fabrication of one device is illustrated. But, in actual fabrication processes, a plurality of scanning devices at wafer level using the MEMS technology are fabricated in quantity at the same time.

First, as illustrated in FIG. 12, first, second and third etch masks 301, 302 and 303, used as etch masks in subsequent etching processes, are formed on upper and lower surfaces of the lower substrate 200 of silicon material and then are patterned. Here, the second etch mask 302 should have high etch selectivity with respect to the silicon, the material of the lower substrate 200, and be appropriate for the subsequent wafer bonding process. A thin film made of insulating material such as photosensitive solution, metal or silicon oxide, silicon nitride or the like is used as the etch masks.

Figure 13:
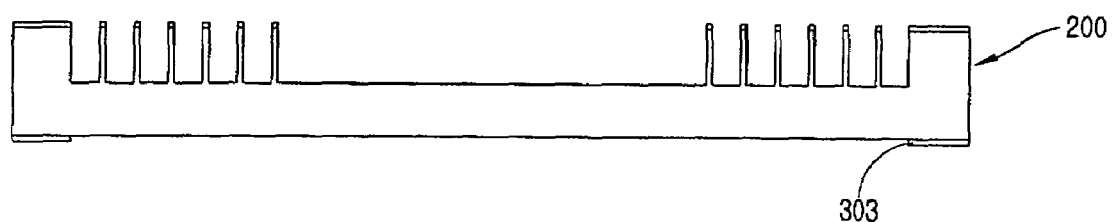

Thereafter, as illustrated in FIG. 13, an upper surface of the lower substrate 200 which are formed of two layers of the first and second etch masks 301 and 302 is anisotropically etched by a predetermined depth by using a Reactive Ion Etch (RIE) or silicon deep RIE technology. Then, the second etch mask 302 is removed.

Figure 14:
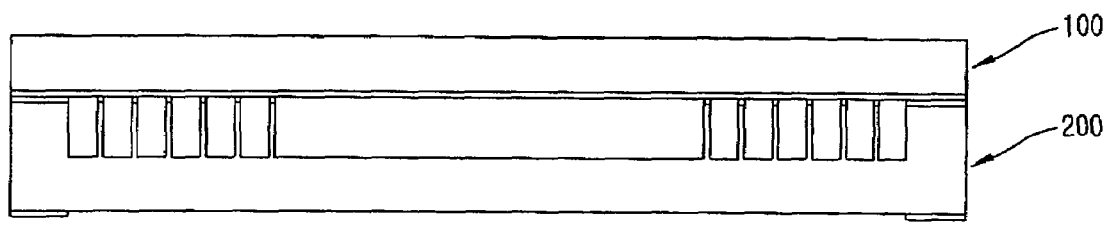

Thereafter, as illustrated in FIG. 14, the upper substrate 100 is bonded to the upper surface of the lower substrate 200 on which the etching process has been performed. At this time, since structures such as the micromirror 110 and torsion beam 140 are formed later on the upper substrate 100, the upper substrate 100 must be processed to have a predetermined thickness. Here, the upper substrate 100 may be first processed to have the predetermined thickness and then is bonded, or the upper substrate 100 may be bonded first and then processed to have the predetermined thickness. The upper and lower substrates 100 and 200 can be bonded to each other through various methods like well-known bonding processes such as fusion bonding, anodic bonding, eutectic bonding, frit bonding or the like or a bonding process using an adhesive.

Figure 15:
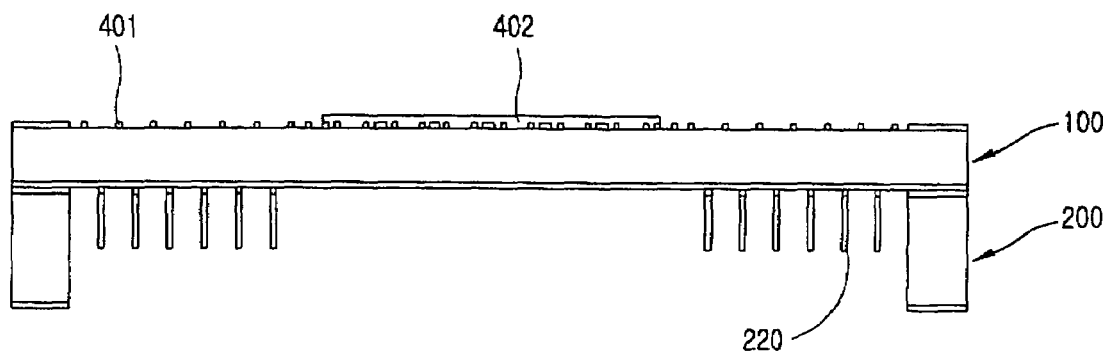

After the upper and lower substrates 100 and 200 are bonded to each other, as illustrated in FIG. 15, a fourth etch mask 401 is formed on the upper substrate 100 and then is patterned to form the movable comb electrode 120 and the support frame 111 of the micromirror unit 110 on the upper substrate 100. Then, a fifth mask 402 is formed on a portion where the micromirror unit 110 is formed on the fourth etch mask 401 and then is patterned. Here, the fifth etch mask 402 should have etch selectivity with respect to silicon, the material of the upper and lower substrates 100 and 200, the fourth etch mask 401 and a material of a bonding surface of and the upper substrate 100 and the lower substrate 200. Then, the surface of the lower substrate 200 on which the third etch mask 303 has been patterned is anisotropically etched by a predetermined depth to thusly form the second center space portion 201 and the second side space portion 202.

Figure 16:
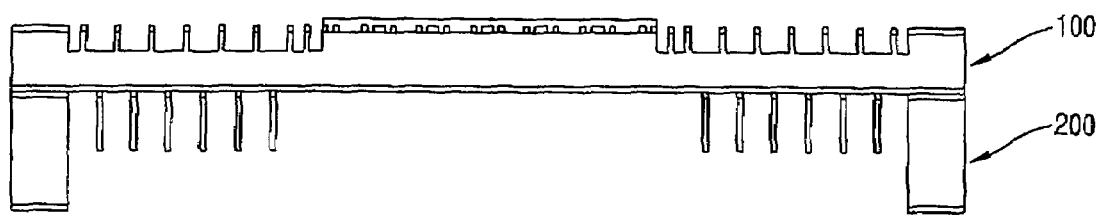

Then, as illustrated in FIG. 16, the surface of the upper substrate 100 on which the fourth and fifth etch masks 401 and 402 have been patterned are etched by a predetermined depth. Here, the portion where the micromirror unit 110 is formed, which is masked by the fifth etch mask, is not etched. Only a portion where the movable comb electrode 120 is formed is etched at a certain depth. The thickness of the micromirror unit 110 can be secured as much as the etched depth.

Figure 17:
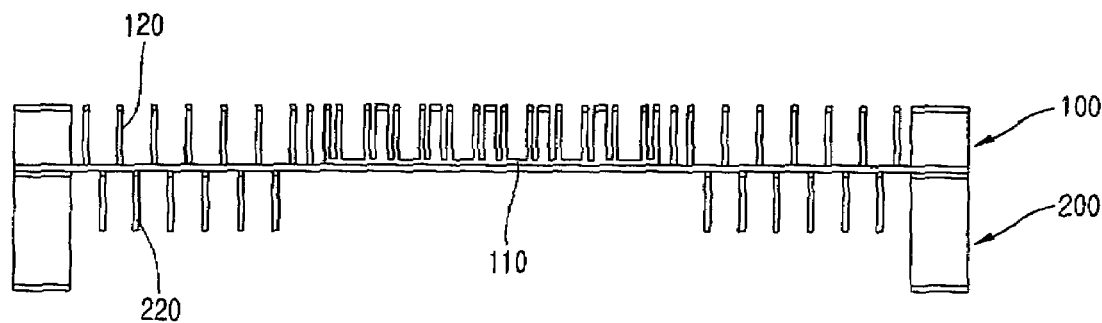

Then, as illustrated in FIG. 17, the fifth etch mask 402 is removed and using the fourth etch mask 401, the upper substrate 100 is anisotropically etched at a predetermined depth, such that the micromirror unit 110 has the predetermined thickness and the support frame 111 is formed on the micromirror unit.

Then, as illustrated in FIG. 18, the fourth etch mask 401 is removed and the inner bonding surface except for outer edge portions of the upper and lower substrates 100 and 200 which serve as a frame of the scanning device is etched to thereby suspend the movable comb electrode 120 and the micromirror unit 110 and form the reflective layer 115 on a lower surface of the micromirror unit 110.

The upper and lower substrates 100 and 200 have an electrically separated structure by the insulating layer 210 in order to apply a voltage for operation of the micromirror unit 110. In addition to fabrication of two substrates by being bonded to each other like the above-described fabrication method, such a structure can be obtained by fabrication using an SOI (silicon-on-insulator) substrate.

Meanwhile, the scanning device using the electrostatic force as a driving source is described above, but another applications such as an electromagnetic force as the driving source are also possible according to design and fabrication thereof.

In addition, though not illustrated in the drawing, the 'M×N' number of scanning micromirror devices having above-described structures may be arranged.

Hereinafter, operation of the scanning device according to one embodiment of the present invention which is constructed and fabricated as described above will be described.

Figure 6:
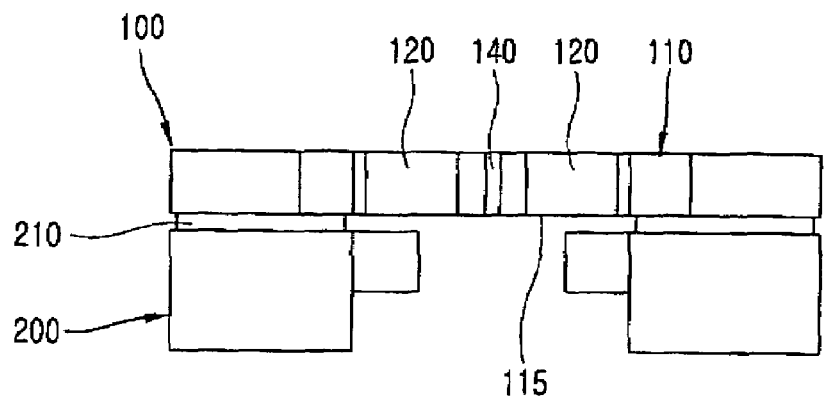
FIGS. 6 and 7 are longitudinal sectional views illustrating operation of a micromirror the scanning device in accordance with one embodiment of the present invention.
Figure 7:
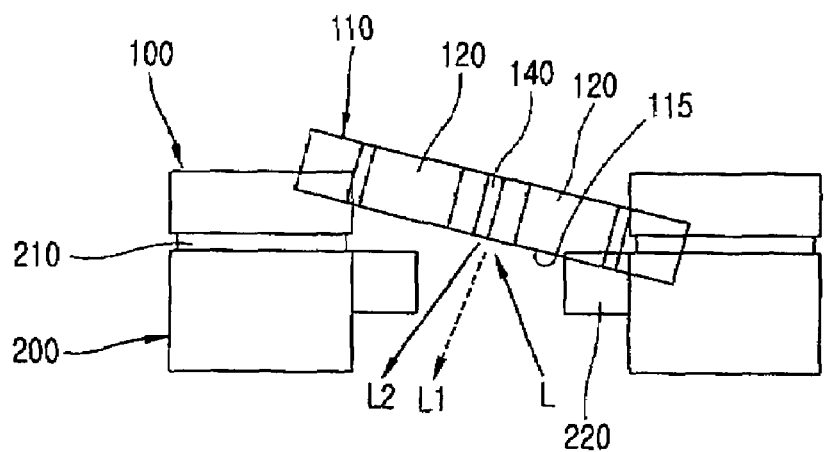

FIGS. 6 and 7 are sectional drawings illustrating operation of the scanning device in accordance with one embodiment of the present invention.

As illustrated therein, in order to operate the scanning device in accordance with the present invention, a voltage is applied between the fixed comb electrode 220 and the movable comb electrode 120 through the both electrode fixing units 230 of the lower substrate 200. That is, in an initial state illustrated in FIG. 6, a potential difference is formed between the movable comb electrode 120 and the fixed comb electrode 220 to thusly generate an electrostatic force. Here, when the voltage is sequentially applied to the fixed comb electrodes 220 formed at both sides in relation to the pivoting axis of the torsion beam 140, the micromirror unit 110 is pivoted at a certain angle from side to side centering around the pivoting axis. Accordingly, as illustrated in FIG. 7, a direction of reflected light relative to incident light is modulated from a direction L1 before the operation to a direction L2 after the operation to thereby implement a scanning function.

Meanwhile, when the movable comb electrode 120 and the fixed comb electrode 220 are formed at only one side of the torsion beam 140, the pivoting axis, bidirectional operation can be implemented because the micromirror unit 110 is operated in an opposite direction by a restoring force of the torsion beam 140 when the voltage is applied and then removed.

Here, since the support frame 111 having the above-described construction is formed at one surface of the micromirror unit 110, when the micromirror unit 110 is pivoted from side to side centering around the pivoting axis, dynamic deflection that the micromirror unit 110 flutters does not occur but the micromirror unit 110 is structurally stably pivoted.

As described, the scanning device in accordance with the present invention can be stably operated and minutely adjust the angle of rotation of the mirror unit as a dynamic deflection phenomenon does not occur when the mirror unit is pivoted around the pivoting axis because the support frame is formed at one surface of the mirror unit.

In addition, since the support frame has a symmetrical structure in relation to the pivoting axis of the mirror unit and decreases in mass toward both ends of the mirror unit, the moment of inertia during rotation is reduced such that structural stability of the mirror unit is obtained and operational sensitivity of the mirror unit and optical performance are improved.

In addition, when fabricated using MEMS processes, the support frame is effectively formed simultaneously with the mirror unit and therefore an additional assembly process requiring for high precision is not necessary. Accordingly, mass productivity can be increased and an unnecessary increase in fabrication costs be prevented.

Accordingly, compared with the scanning device having the conventional micromirror structure, the present invention can implement structurally stable high scanning speed and perform an operation of a wide scanning range. At last, various applications to a high performance scanning system are possible.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A scanning device comprising:
   a substrate having a center space portion and a side space portion, the side space portion disposed at each side of the center space portion;
   a mirror unit disposed at the center space portion and having a support frame, the support frame coupled with the mirror unit in order to prevent dynamic deflection of the mirror unit and supporting the mirror unit;
   a pair of elastic rotation support elements disposed at each side space portion in order to support the mirror unit against the substrate and to be a rotating axis of the mirror unit; and
   a driving unit provided at the side space portion and driving the pair of elastic rotation support elements in order to rotate the mirror unit,
   wherein the driving unit comprises:
   a movable electrode extended from an end of the mirror unit which is adjacent to an elastic rotation support element and disposed at the side space portion; and
   a fixed electrode extended from a portion of the substrate and disposed at the side space portion in order to interwork with the movable electrode by electrostatic force.

2. The device of claim 1, wherein the support frame is symmetrically formed in relation to the rotating axis of the mirror unit.

3. The device of claim 1, wherein the support frame decreases in mass toward its both ends from the rotating axis of the mirror unit.

4. The device of claim 1, wherein a plurality of recesses are formed on the support frame.

5. The device of claim 4, wherein the plurality of recesses are symmetrically formed in relation to the rotating axis of the mirror unit.

6. The device of claim 4, wherein the plurality of recesses have hexagonal shapes, and are gathered together in a honey comb shape.

7. The device of claim 1, wherein an area of the mirror unit is greater than an area of the support frame.

8. The device of claim 1, wherein the support frame decreases in thickness toward its both ends from the rotating axis of the mirror unit.

9. The device of claim 1, wherein the support frame is constructed such that a plurality of diamond-shaped protrusion portions and triangle-shaped groove portions are alternately formed at intervals.

10. The device of claim 1, wherein the support frame is formed as a hexahedron of which an upper surface is lozenge shaped, and diagonally opposite apexes are located on the rotating axis of the mirror unit.

11. The device of claim 9, wherein four side surfaces of the support frame are curved toward a center of the support frame.

12. The device of claim 1, wherein the elastic rotation support element is a torsion beam.

13. The device of claim 1, wherein the movable electrode and the fixed electrode are formed in a comb shape.

14. The device of claim 1, wherein the movable electrode and the fixed electrode are disposed at both sides or at one side in relation to the mirror unit.

15. The device of claim 1, wherein the movable electrode and the fixed electrode are disposed at both sides or at one side of the rotating axis.

16. The device of claim 13, wherein the movable electrode and the fixed electrode are partially overlapped by a predetermined distance in a longitudinal direction of the substrate.

17. A scanning device array comprising:

a plurality of unit scanning devices arranged in a matrix form, wherein each scanning device comprises:

a substrate having a center space portion and a side space portion, the side space portion disposed at each side of the center space portion;

a mirror unit disposed at the center space portion and having a support frame, the support frame coupled with the mirror unit in order to prevent dynamic deflection of the mirror unit and supporting the mirror unit;

a pair of elastic rotation support elements disposed at each side space portion in order to support the mirror unit against the substrate and to be a rotating axis of the mirror unit; and a driving unit provided at the side space portion and driving the pair of elastic rotation support elements in order to rotate the mirror unit, wherein the driving unit comprises:

a movable electrode extended from an end of the mirror unit which is adjacent to an elastic rotation support element and disposed at the side space portion; and a fixed electrode extended from a portion of the substrate and disposed at the side space portion in order to interwork with the movable electrode by electrostatic force.

* * * * *